United States Patent
Joo et al.

(10) Patent No.: US 12,289,974 B2
(45) Date of Patent: Apr. 29, 2025

(54) DISPLAY DEVICE

(71) Applicant: Samsung Display Co., Ltd., Yongin-Si (KR)

(72) Inventors: Sun-Kyu Joo, Suwon-si (KR); Keunchan Oh, Hwaseong-si (KR); Inok Kim, Osan-si (KR); Jae Cheol Park, Hwaseong-si (KR); Jaemin Seong, Suwon-si (KR); Yousik Shin, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 695 days.

(21) Appl. No.: 17/332,782

(22) Filed: May 27, 2021

(65) Prior Publication Data
US 2021/0408162 A1     Dec. 30, 2021

(30) Foreign Application Priority Data

Jun. 24, 2020  (KR) .................... 10-2020-0076887

(51) Int. Cl.
| | |
|---|---|
| *H10K 59/35* | (2023.01) |
| *H10K 59/122* | (2023.01) |
| *H10K 59/38* | (2023.01) |
| *H10K 71/00* | (2023.01) |

(52) U.S. Cl.
CPC ......... *H10K 59/353* (2023.02); *H10K 59/122* (2023.02); *H10K 59/38* (2023.02)

(58) Field of Classification Search
CPC .... H10K 59/353; H10K 59/122; H10K 59/38; H10K 59/352
See application file for complete search history.

(56) References Cited

U.S. PATENT DOCUMENTS

| | | | |
|---|---|---|---|
| 8,263,173 B2 | 9/2012 | Wang et al. | |
| 9,734,745 B2 | 8/2017 | Gu | |
| 2014/0197396 A1 | 7/2014 | Madigan | |
| 2016/0232876 A1* | 8/2016 | Kim | ............... G09G 3/001 |
| 2018/0308907 A1* | 10/2018 | Jin | ............... H10K 59/353 |
| 2019/0378882 A1 | 12/2019 | Zhang | |

FOREIGN PATENT DOCUMENTS

| | | | | |
|---|---|---|---|---|
| CN | 105789249 A | | 7/2016 | |
| KR | 10-1691154 B1 | | 1/2017 | |
| KR | 10-2018-0092326 A | | 8/2018 | |
| KR | 20180092326 | * | 8/2018 | ........... G02F 1/1343 |

OTHER PUBLICATIONS

Extended European Search Report, Application No. 21180700.3, dated May 13, 2022, 20 pages.

* cited by examiner

*Primary Examiner* — Herve-Louis Y Assouman
(74) *Attorney, Agent, or Firm* — Innovation Counsel LLP

(57) ABSTRACT

A display device includes a display panel including a first pixel area and a second pixel area. The first pixel area includes a first pixel, a second pixel, and a third pixel, and the second pixel area includes a fourth pixel, a fifth pixel, and a sixth pixel. The first pixel and the second pixel are arranged to be adjacent to each other in a first direction, and the third pixel is arranged to be adjacent to the first pixel and the second pixel in a second direction that intersects the first direction. The third pixel and the fourth pixel emitting a same color are arranged to be adjacent to each other in the second direction, the fifth pixel is spaced apart from the first pixel in the second direction, and the sixth pixel is spaced apart from the second pixel in the second direction.

10 Claims, 11 Drawing Sheets

DISPLAY DEVICE

CROSS-REFERENCE TO RELATED APPLICATION

This application claims priority under 35 USC § 119 to Korean Patent Application No. 10-2020-0076887 filed on Jun. 24, 2020 in the Korean Intellectual Property Office (KIPO), the disclosure of which is incorporated herein by reference in its entirety.

BACKGROUND

1. Field

The present disclosure relates to a display device. More particularly, the present disclosure relates to a display device including a plurality of pixels arranged based on their colors.

2. Description of the Related Art

With the development of technology, types of display devices have been diversified. For example, popular types of display devices include an organic light emitting display device, a liquid crystal display device, and a plasma display device.

Among the various types of display devices, the organic light emitting display device includes an organic light emitting diode and a color conversion layer. Ink may be dropped through an ink jet process to form the organic light emitting diode and the color conversion layer. However, during the inkjet process, the ink may not precisely drop between adjacent bank structures and may spill onto the bank structure due to an alignment error. This may cause a layer disposed on the bank structure to have a non-uniform height so that a gap defect may occur in the organic light emitting display device.

SUMMARY

A display device according to an embodiment may include a display panel including a first pixel area and a second pixel area. The first pixel area may include a first pixel emitting a first color, a second pixel emitting a second color, and a third pixel emitting a third color. The second pixel area may include a fourth pixel emitting the third color, a fifth pixel emitting the first color, and a sixth pixel emitting the second color. The first pixel and the second pixel may be arranged to be adjacent to each other in a first direction, and the third pixel may be arranged to be adjacent to the first pixel and the second pixel in a second direction that intersects the first direction. The third pixel and the fourth pixel may be arranged to be adjacent to each other in the second direction, the fifth pixel may be spaced apart from the first pixel in the second direction, and the sixth pixel may be spaced apart from the second pixel in the second direction.

In an embodiment, the first pixel area and the second pixel area may be alternately arranged in the second direction.

In an embodiment, the first pixel area may be repeatedly arranged along the first direction, and the second pixel area may be repeatedly arranged along the first direction.

In an embodiment, the first pixel area and the second pixel area may be alternately arranged in the first direction.

In an embodiment, the first color, the second color, and the third color may be different from each other.

In an embodiment, each of the first pixel, the second pixel, the third pixel, the fourth pixel, the fifth pixel, and the sixth pixel may have a rectangular shape.

In an embodiment, the first pixel may include a first protruding portion protruding in the second direction toward the fifth pixel, the second pixel may include a second protruding portion protruding in the second direction toward the sixth pixel, and the third pixel may be disposed between the first protruding portion and the second protruding portion. The fifth pixel may include a third protruding portion protruding in a direction opposite to the second direction toward the first pixel, the sixth pixel may include a fourth protruding portion protruding in a direction opposite to the second direction toward the second pixel, and the fourth pixel may be disposed between the third protruding portion and the fourth protruding portion.

In an embodiment, the first pixel area and the second pixel area may be arranged in a matrix form.

In an embodiment, the first pixel area and the second pixel area may be symmetrical by a line extending in the first direction.

In an embodiment, each of the first pixel, the second pixel, the third pixel, the fourth pixel, the fifth pixel, and the sixth pixel may include a color filter may be formed by an inkjet process.

A display device according to an embodiment may include a display panel including a first pixel area and a second pixel area that is arranged to be adjacent to the first pixel in a first direction. The first pixel area may include a first pixel emitting a first color, a second pixel emitting a second color, and a third pixel emitting a third color. The second pixel area may include a fourth pixel emitting the third color, a fifth pixel emitting the first color, and a sixth pixel emitting the second color. The first pixel and the second pixel may be arranged to be adjacent to each other in a second direction that intersects the first direction, and the third pixel may be adjacent to the first pixel and the second pixel in the first direction. The third pixel and the fourth pixel may be arranged to be adjacent to each other in the first direction, the fifth pixel may be spaced apart from the first pixel in the first direction, and the sixth pixel may be spaced apart from the second pixel in the first direction.

In an embodiment, the first pixel area and the second pixel area may be alternately arranged in the first direction.

In an embodiment, the first pixel area may be repeatedly arranged along the second direction, and the second pixel area may be repeatedly arranged along the second direction.

In an embodiment, the first pixel area and the second pixel area may be alternately arranged in the second direction.

In an embodiment, the first color, the second color, and the third color may be different from each other.

In an embodiment, each of the first pixel, the second pixel, the third pixel, the fourth pixel, the fifth pixel, and the sixth pixel may have a rectangular shape.

In an embodiment, the first pixel may include a first protruding portion protruding in the first direction toward the fifth pixel, the second pixel may include a second protruding portion protruding in the first direction toward the sixth pixel, and the third pixel may be disposed between the first protruding portion and the second protruding portion. The fifth pixel may include a third protruding portion protruding in a direction opposite to the first direction toward the first pixel, the sixth pixel may include a fourth protruding portion protruding in a direction opposite to the first direction toward the second pixel, and the fourth pixel may be disposed between the third protruding portion and the fourth protruding portion.

In an embodiment, the first pixel area and the second pixel area may be arranged in a matrix form.

In an embodiment, the first pixel area and the second pixel area may symmetrical by a line extending in the second direction.

In an embodiment, each of the first pixel, the second pixel, the third pixel, the fourth pixel, the fifth pixel, and the sixth pixel may include a color filter that may be formed by an inkjet process.

As described above, because the third and fourth pixels that emit the third color, the first pixel and the fifth pixel that emit the first color, and the second pixel and the sixth pixel that emit the second color are respectively arranged to be adjacent to each other in the second direction, the display device may prevent an erroneously adhesion of ink that may occur during an inkjet process to form the pixels.

BRIEF DESCRIPTION OF THE DRAWINGS

Illustrative, non-limiting embodiments of the present disclosure will be more clearly understood from the following detailed description taken in conjunction with the accompanying drawings.

DETAILED DESCRIPTION OF THE EMBODIMENTS

Hereinafter, display devices in accordance with various embodiments of the present disclosure will be explained in detail with reference to the accompanying drawings.

Figure 1:
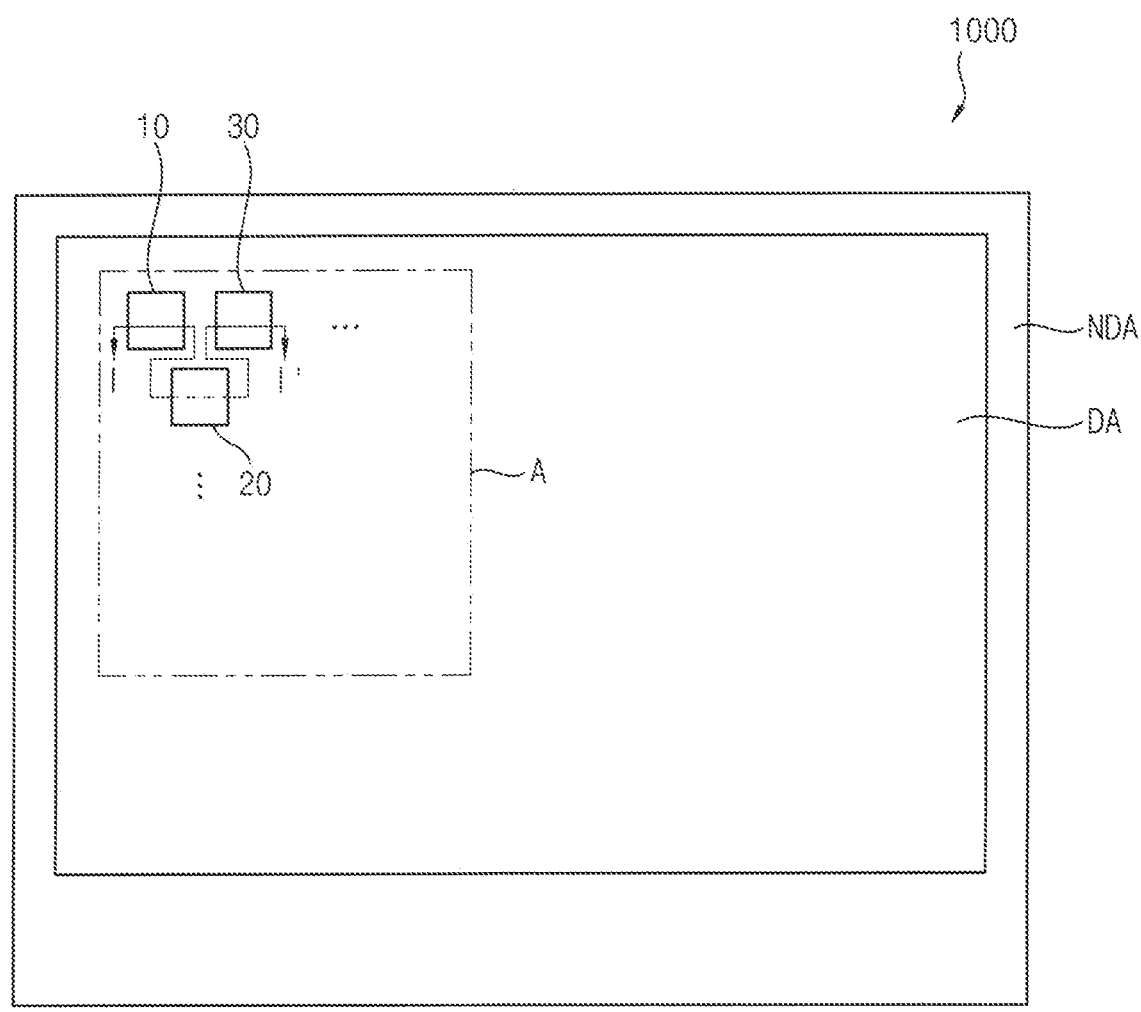
FIG. 1 is a plan view illustrating a display device according to an embodiment of the present disclosure.

FIG. 1 is a plan view illustrating a display device according to an embodiment of the present disclosure.

Referring to FIG. 1, the display device may include a display panel 1000. The display panel 1000 may include a display area DA and a non-display area NDA. A plurality of pixels may be disposed in the display area DA. In an embodiment, the plurality of pixels may be arranged in a matrix form. In addition, the plurality of pixels may include a plurality of pixel areas, and three of the plurality of pixels, for example, a first pixel 10, a second pixel 20, and a third pixel 30, may be arranged in a triangular shape in each of the plurality of pixel areas. However, this is merely an example, and the plurality of pixels may be arranged in various ways and/or shapes.

The non-display area NDA may surround the display area DA. A driver (not shown) for driving the plurality of pixels may be disposed in the non-display area NDA. The driver may include a scan driver, a data driver, a light emitting driver, a signal controller, and the like.

Figure 2:
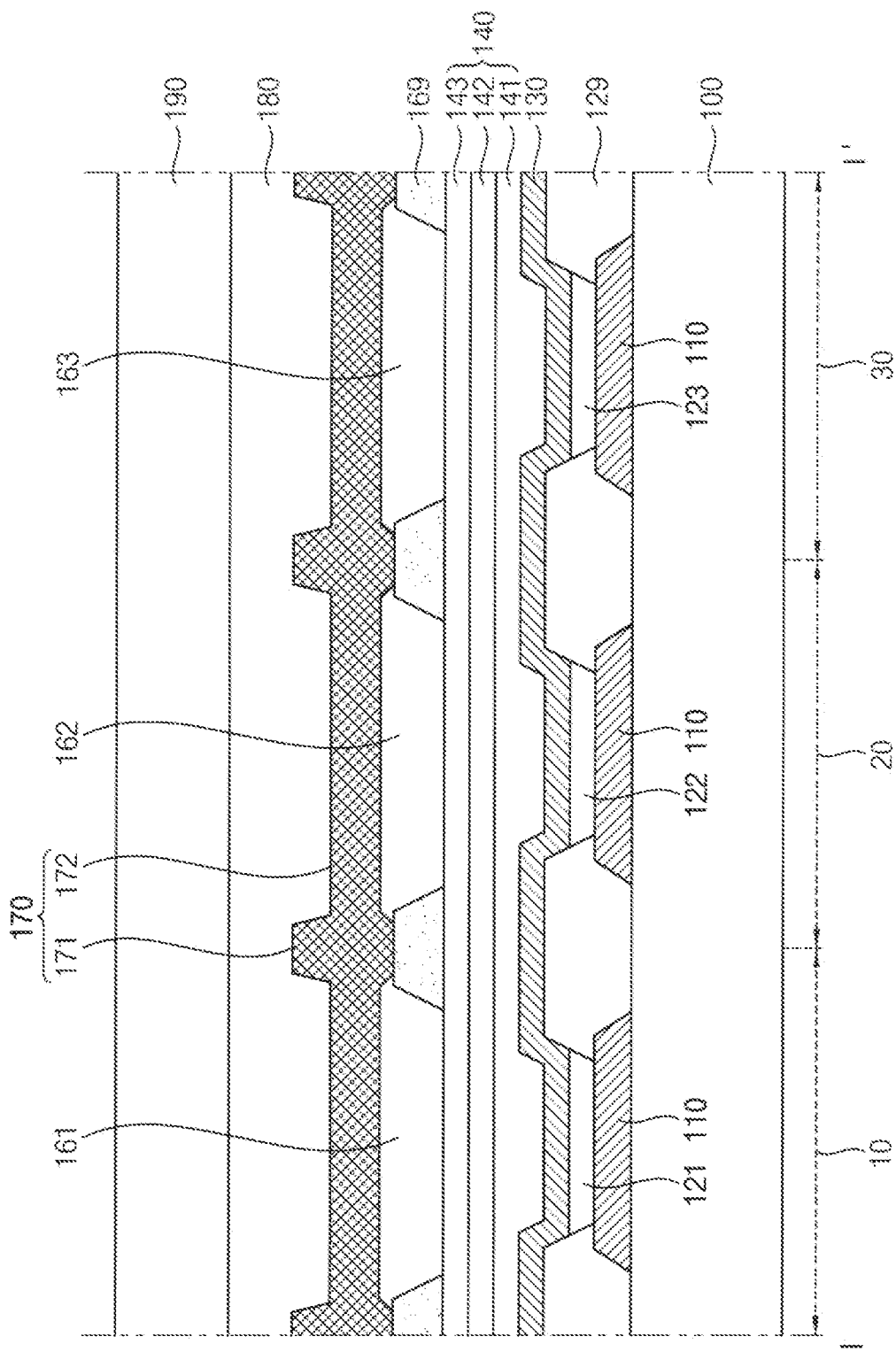
FIG. 2 is a cross-sectional view taken along the line I-I' of FIG. 1 according to one embodiment.

FIG. 2 is a cross-sectional view taken along the line I-I' of FIG. 1 according to one embodiment.

Referring to FIGS. 1 and 2, the display device may include a first substrate 100, a plurality of first electrodes 110, a plurality of light emitting layers 121, 122, and 123, a second electrode 130, a pixel defining layer 129, an encapsulation layer 140, a black matrix 169, a plurality of color filters 161, 162, and 163, a protective layer 170, an adhesive layer 180, and a second substrate 190.

The plurality of light emitting layers 121, 122, and 123 may include a red light emitting layer 121, a blue light emitting layer 122, and a green light emitting layer 123. However, this is merely an example, and the plurality of light emitting layers 121, 122, and 123 may be light emitting layers emitting different colors. In some embodiments, the plurality of light emitting layers 121, 122, and 123 may emit the same color. The encapsulation layer 140 may include a first inorganic layer 141, an organic layer 142, and a second inorganic layer 143. However, this is merely an example, and the encapsulation layer 140 may be a single layer or a multilayer including four or more layers. The plurality of color filters 161, 162, and 163 may include a red color filter 161, a blue color filter 162, and a green color filter 163.

The first substrate 100 may include an insulating substrate. The insulating substrate may be a rigid substrate or a flexible substrate. For example, the insulating substrate may include glass, quartz, a polymer resin, plastic, or the like. Examples of the polymer resin include, but are not limited to, polyimide, polyacrylate, polycarbonate, or any combination thereof.

The first substrate 100 may further include other structures disposed on the insulating substrate. For example, the first substrate 100 may further include a line, an electrode, an insulating layer, and the like. In addition, the first substrate 100 may further include a plurality of thin film transistors disposed on the insulating substrate. Some of the plurality of thin film transistors may be connected to the plurality of first electrodes 110.

The plurality of first electrodes 110 may be disposed on the first substrate 100. The plurality of first electrodes 110 may be disposed to be spaced apart from each other. In an embodiment, the plurality of first electrodes 110 may be pixel electrodes disposed for each of the plurality of pixels. In another embodiment, the plurality of first electrodes 110 may be anode electrodes or cathode electrodes. The plurality of first electrodes 110 may include a transparent conductive material such as indium-tin oxide ("ITO"), indium-zinc oxide ("IZO"), zinc oxide ("ZnO"), and indium oxide ("$In_2O_3$"). Alternatively, the plurality of first electrodes 110 may include silver ("Ag"), magnesium ("Mg"), aluminum ("Al"), platinum ("Pt"), lead ("Pb"), gold ("Au"), nickel ("Ni"), niobium ("Nd"), iridium ("Ir"), chromium ("Cr"), lithium ("Li"), calcium ("Ca"), or any mixture thereof.

The pixel defining layer 129 may be disposed on the first substrate 100 to cover a portion of the plurality of first electrodes 110. That is, the pixel defining layer 129 may form an opening exposing at least a portion of each of the plurality of first electrodes 110. The pixel defining layer 129 may include an organic material or an inorganic material. For example, the pixel defining layer 129 may include a photoresist, a polyimide resin, an acrylic resin, a silicone compound, and a polyacrylic resin.

Each of the plurality of light emitting layers 121, 122, and 123 may be disposed on the plurality of first electrodes 110 in the openings of the pixel defining layer 129.

The second electrode 130 may be disposed on the plurality of light emitting layers 121, 122, and 123 and the pixel defining layer 129. The second electrode 130 may be a common electrode disposed to cover the plurality of pixels. The second electrode 130 may include substantially the same material as the plurality of first electrodes 110. Also, The second electrode 130 may include a material having a low work function. A first electrode 110 of the plurality of first electrodes 110, a light emitting layer that corresponds to the first electrode 110 among the plurality of light emitting layers 121, 122, and 123, and the second electrode 130 may constitute an organic light emitting diode. Although the display device is illustrated as an organic light emitting display device, but is not limited thereto, and may be of various types of display devices such as a liquid crystal display device and a plasma display device.

The encapsulation layer 140 may be disposed on the second electrode 130. The first inorganic layer 141 and the second inorganic layer 143 of the encapsulation layer 140 may include at least one of silicon oxide ("$SiO_x$"), silicon nitride ("$SiN_x$"), and silicon oxynitride ("$SiO_xN_y$").

The black matrix 169 may be disposed along a boundary of the plurality of pixels and may include an opening exposing the plurality of pixels. The plurality of light emitting layers 121, 122, and 123 may overlap the openings of the black matrix 169. The black matrix 169 may include a light absorbing material or a light reflective material. For example, the black matrix 169 may include a resin having a black color, a reflective metal material such as chromium, or the like.

The plurality of color filters 161, 162, and 163 may be disposed on the encapsulation layer 140 in the openings of the black matrix 169. In an embodiment, the plurality of color filters 161, 162, and 163 may cover at least a portion of the black matrix 169. The red color filter 161 may selectively transmit red light, the blue color filter 162 may selectively transmit blue light, and the green color filter 163 may selectively transmit green light. The red color filter 161 may be disposed on the red light emitting layer 121, the blue color filter 162 may be disposed on the blue light emitting layer 122, and the green color filter 163 may be disposed on the green light emitting layer 123.

The protective layer 170 may be disposed on the black matrix 169 and the plurality of color filters 161, 162, and 163. The protective layer 170 may protect elements and/or layers disposed thereunder from an external impact. The protective layer 170 may include a transparent organic material. In an embodiment, the protective layer 170 may include a flat portion 172 and a protruding portion 171 that protrudes upwardly from the flat portion 172 in a thickness direction of the display panel 1000. The protective layer 170 may further include a downward protruding portion that protrudes downwardly from the flat portion 172 in the thickness direction of the display panel 1000. The downward protruding portion may contact the black matrix 169. The protruding portion 171 and the flat portion 172 may effectively protect the lower elements and/or layers from the external impact.

The second substrate 190 may be disposed on the protective layer 170. The second substrate 190 may include a transparent material such as glass or plastic. The second substrate 190 may be a window substrate, a sealing substrate, or a protective substrate.

The adhesive layer 180 may be disposed between the second substrate 190 and the protective layer 170. The adhesive layer 180 may include an adhesive film having adhesive properties. For example, the adhesive layer 180 may include an optically transparent adhesive, an optically transparent resin, or the like.

In an embodiment, the plurality of emission layers 121, 122, and 123 and the plurality of color filters 161, 162, and 163 may be formed by an inkjet process. However, inks that may be erroneously adhered during an inkjet process may cause a defect such as an inconsistent level of the display device. Structures that are capable of preventing erroneous adhesion of the ink according to various embodiments of the present disclosure will be described below.

Although FIG. 2 illustrates the areas corresponding to the first pixel 10, the second pixel 20, and the third pixel 30, this is merely an example and the cross-sectional structure of the display device is not limited thereto. FIG. 2 may correspond to a plurality of pixels of different embodiments to be described later. For example, FIG. 2 may correspond to a first pixel 15, a second pixel 25, and a third pixel 35 shown in FIG. 4. In addition, FIG. 2 may correspond to a fourth pixel 40, a fifth pixel 50, and a sixth pixel 60 shown in FIG. 3.

Figure 3:
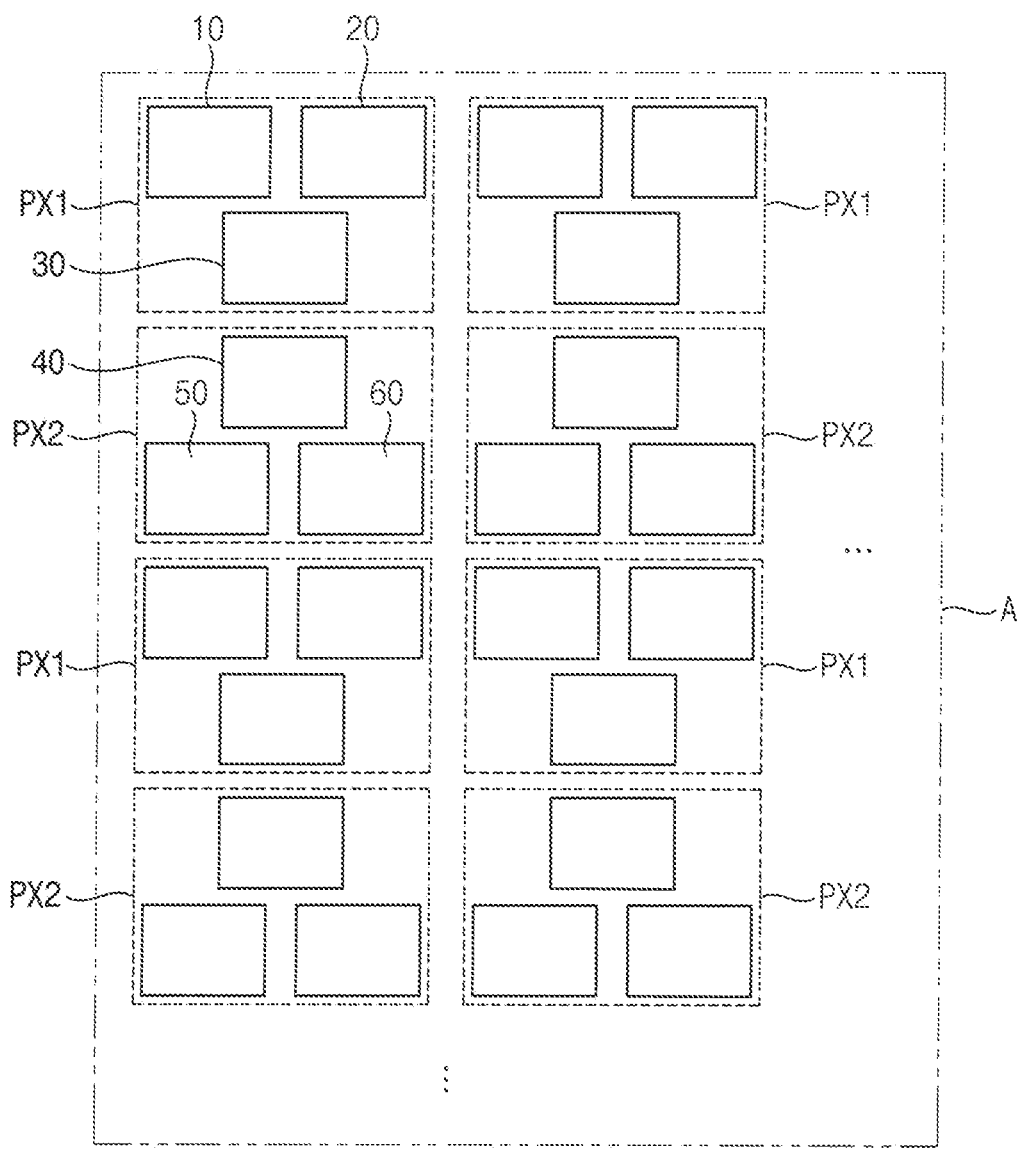
FIG. 3 is an enlarged view of the area A shown in FIG. 1 according to one embodiment.

FIG. 3 is an enlarged view of the area A shown in FIG. 1 according to one embodiment.

Referring to FIGS. 1 and 3, the area A may include a first pixel area PX1 and a second pixel area PX2. The first pixel area PX1 may include the first pixel 10, the second pixel 20, and the third pixel 30. In an embodiment, the first pixel 10 emits a first color, the second pixel 20 emits a second color, and the third pixel 30 emits a third color. For example, the first color may include a red color, the second color may include a blue color, and the third color may include a green color. However, this is merely an example, and the first pixel 10, the second pixel 20, and the third pixel 30 may emit various other colors.

In an embodiment, the first pixel 10 and the second pixel 20 may be disposed in a first pixel row extending in a first direction DR1. The third pixel 30 may be disposed in a second pixel row below the first pixel row in which the first pixel 10 and the second pixel 20 are disposed in a second direction DR2 that intersects the first direction DR1. For example, at least a portion of the third pixel 30 may overlap each of the first pixel 10 and second pixel 20 in the second direction DR2.

The second pixel area PX2 may be located in the second direction DR2 from the first pixel area PX1. The second pixel area PX2 may include the fourth pixel 40, the fifth pixel 50, and the sixth pixel 60. In an embodiment, the fourth pixel 10 may emit the third color, the fifth pixel 50 may emit the first color, and the sixth pixel 60 may emit the second color. The first pixel area PX1 and the second pixel area PX2 may be symmetrical by a line extending in the first direction DR1.

The fourth pixel 40 may be disposed adjacent to the third pixel 30 in the third pixel row below the second pixel row in which the third pixel 30 is disposed. The fourth pixel 40 may be disposed in the same pixel column as the third pixel 30 in the second direction DR2. Since the third pixel 30 and the fourth pixel 40 emitting the same second color are disposed adjacent to each other, the probability of erroneous adhesion of the ink during an inkjet process may be reduced.

In an embodiment, the fifth pixel 50 may be disposed in the same pixel column as the first pixel 10 in the second direction DR2. The sixth pixel 60 may be disposed in the same pixel column as the second pixel 20 in the second direction DR2. The fifth pixel 50 and the sixth pixel 60 may be disposed in a fourth pixel row below the third pixel row in which the fourth pixel 40 is disposed. For example, at least a portion of the fourth pixel 40 may overlap each of the fifth pixel 50 and the sixth pixel 60 in the second direction DR2.

In an embodiment, the first pixel area PX1 and the second pixel area PX2 may be alternately arranged in the second direction DR2. That is, the first pixel area PX1 may be located adjacent to the second pixel area PX2 in the second direction DR2. Accordingly, the first pixel 10 and the fifth pixel 50 emitting the same color may be disposed adjacent to each other, and the second pixel 20 and the sixth pixel 60 emitting the same color may be disposed adjacent to each other. Through these arrangements of the pixels, the probability that the ink is erroneously adhered during an inkjet process may be reduced.

In addition, in an embodiment, the first pixel area PX1 may be arranged adjacent to each other in the first direction DR1. The second pixel area PX2 may be arranged adjacent to each other in the first direction DR1.

Figure 4:
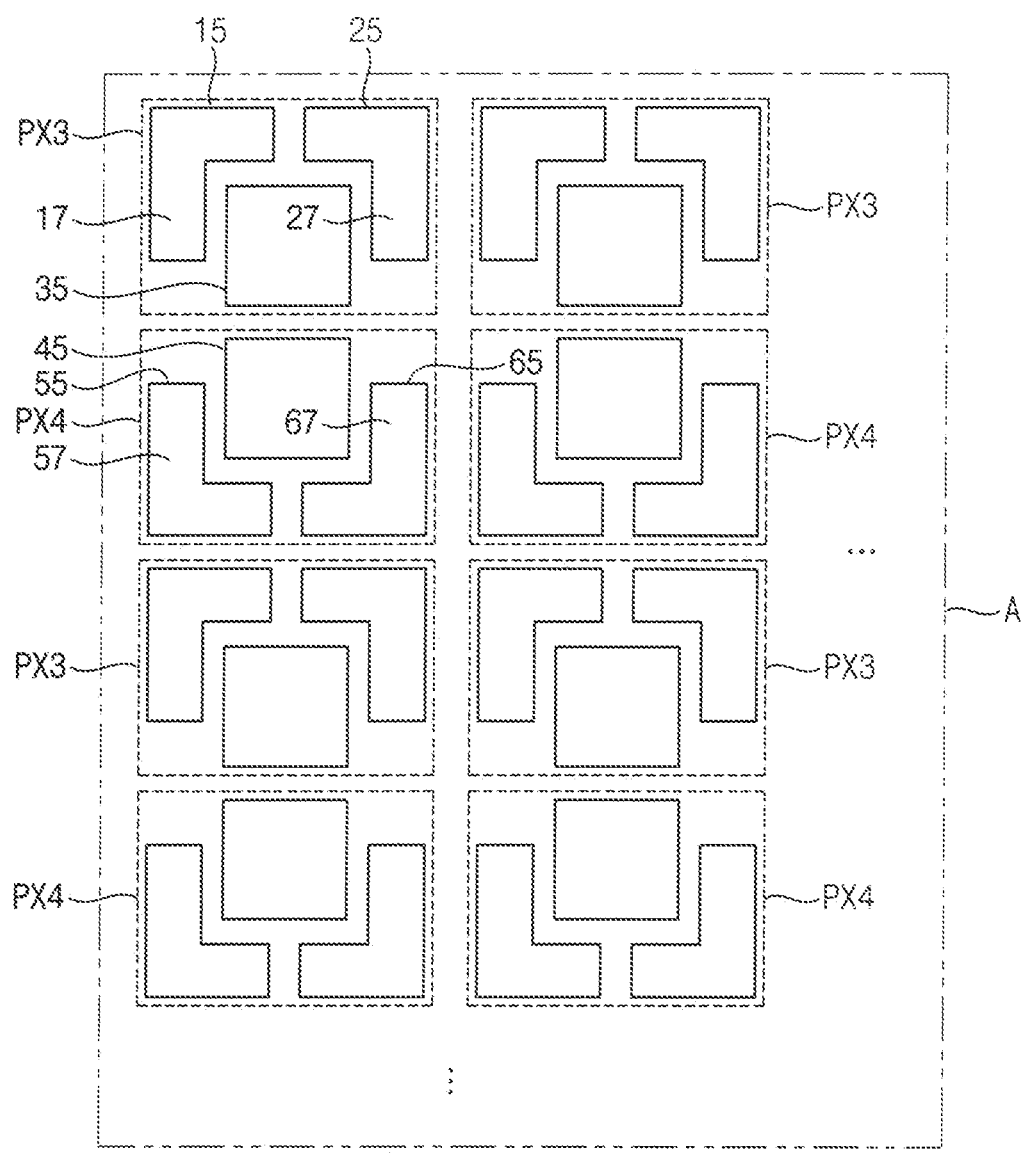
FIG. 4 is an enlarged view of the area A shown in FIG. 1 according to another embodiment.

FIG. 4 is an enlarged view of the area A shown in FIG. 1 according to another embodiment. FIG. 4 may be substantially the same as the structure of FIG. 3 except that some pixels in FIG. 3 have different shapes. Therefore, redundant descriptions will be omitted.

Referring to FIG. 4, the area A may include a first pixel area PX3 and a second pixel area PX4. The first pixel area PX3 may include the first pixel 15, the second pixel 25, and the third pixel 35. In an embodiment, the first pixel 15 may include a first protruding portion 17 protruding in the second direction DR2 toward the second pixel area PX4. The second pixel 25 may include a second protruding portion 27 protruding in the second direction DR2 toward the second pixel area PX4. The third pixel 35 may be disposed between the first protruding portion 17 and the second protruding portion 27.

The second pixel area PX4 may include a fourth pixel 45, a fifth pixel 55, and a sixth pixel 65. In an embodiment, the fifth pixel 55 may include a third protruding portion 57 protruding in a direction opposite to the second direction DR2 toward the first pixel area PX3. The sixth pixel 65 may include a fourth protruding portion 67 protruding in a direction opposite to the second direction DR2 toward the first pixel area PX3. The fourth pixel 45 may be disposed between the third protruding portion 57 and the fourth protruding portion 67.

Since the third pixel 35 and the fourth pixel 45 are disposed adjacent to each other in the second direction DR2 in the same pixel column, the probability of the ink being erroneously adhered during an inkjet process may be reduced.

In an embodiment, the first pixel area PX3 and the second pixel area PX4 may be symmetrical by a line extending in the first direction DR1 and alternately arranged in the second direction DR2. That is, the first pixel area PX3 may be located adjacent to the second pixel area PX4 in the second direction DR2. Accordingly, the fifth pixel 55 and the sixth pixel 65 are disposed adjacent to the first pixel 15 and the second pixel 25, respectively, and the probability of erroneous adherence of the ink during an ink jet process may be reduced.

Figure 5:
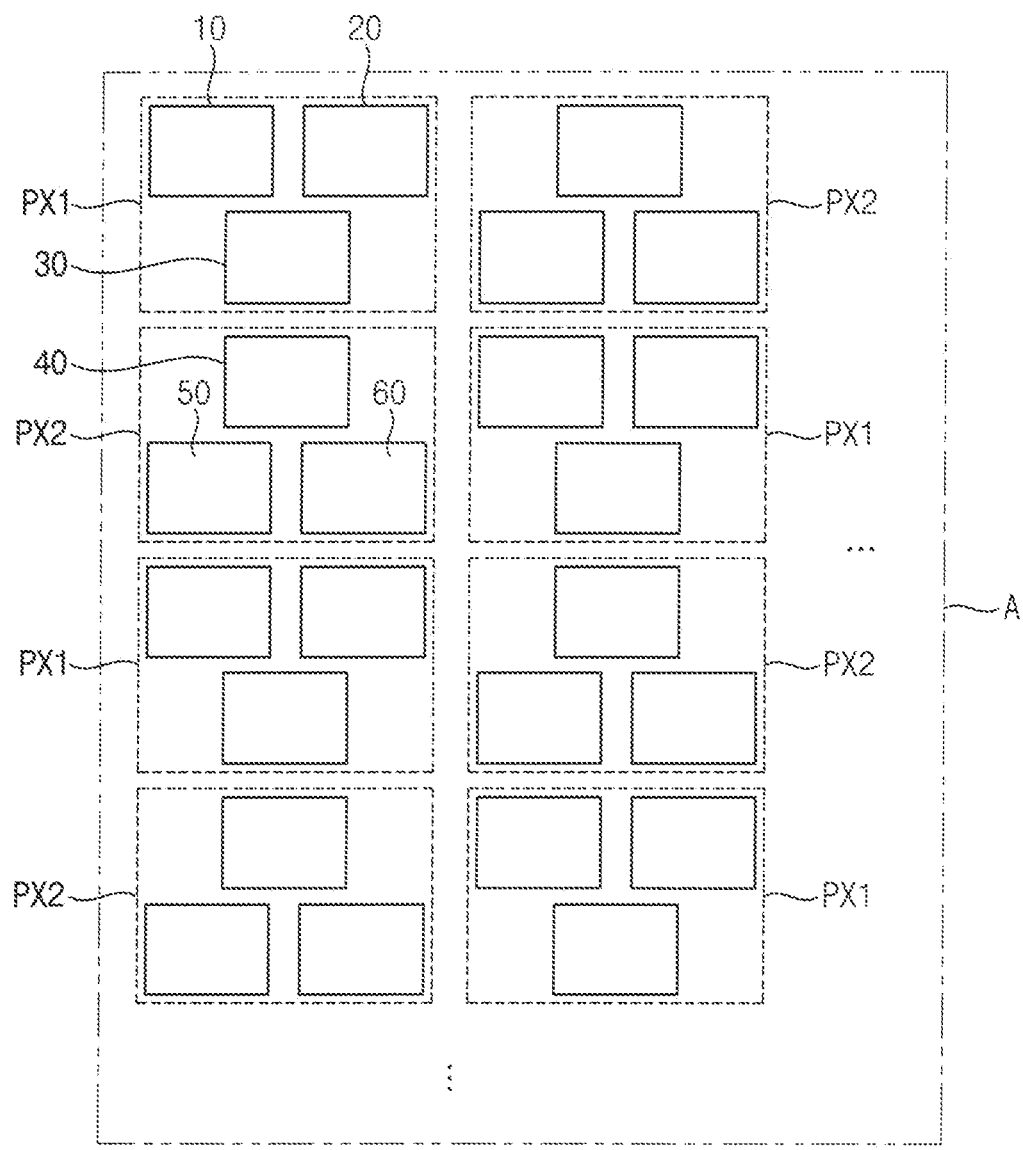
FIG. 5 is an enlarged view of the area A shown in FIG. 1 according to yet another embodiment.

FIG. 5 is an enlarged view of the area A shown in FIG. 1 according to yet another embodiment.

Referring to FIGS. 1, 2 and 5, the area A may include the first pixel area PX1 and the second pixel area PX2. The first pixel area PX1 may include the first pixel 10, the second pixel 20, and the third pixel 30.

In an embodiment, the first pixel 10 and the second pixel 20 may be disposed in a first pixel row extending in the first direction DR1. The third pixel 30 may be disposed in a second pixel row below the first pixel row in which the first pixel 10 and the second pixel 20 are disposed. For example, at least a portion of the third pixel 30 may overlap each of the first pixel 10 and the second pixel 20 in the second direction DR2.

The second pixel area PX2 may be located in the second direction DR2 from the first pixel area PX1. the second pixel area PX2 may include a fourth pixel 40, a fifth pixel 50, and a sixth pixel 60. In an embodiment, the fourth pixel 10 may emit the third color, the fifth pixel 50 may emit the first color, and the sixth pixel 60 may emit the second color.

The fourth pixel 40 may be disposed adjacent to the third pixel 30 in a third pixel row below the second pixel row in which the third pixel 30 is disposed. The fourth pixel 40 may be disposed in the same pixel column as the third pixel 30 in the second direction DR2. Since the third pixel 30 and the fourth pixel 40 emitting the same second color are disposed adjacent to each other, the probability of erroneous adherence of the ink during an inkjet process may be reduced.

In an embodiment, the fifth pixel 50 may be disposed in the same pixel column as the first pixel 10 in the second direction. The sixth pixel 60 may be disposed in the same pixel column as the second pixel 20 in the second direction DR2. The fifth pixel 50 and the sixth pixel 60 may be disposed in a fourth pixel row below the third pixel row in which the fourth pixel 40 is disposed. For example, at least a portion of the fourth pixel 40 may overlap each of the fifth pixel 50 and the sixth pixel 60 in the second direction DR2.

In an embodiment, the first pixel area PX1 and the second pixel area PX2 may be alternately arranged in the second direction DR2. That is, the first pixel area PX1 may be located adjacent to the second pixel area PX2 in the second direction DR2. Accordingly, the first pixel 10 and the fifth pixel 50 emitting the same color may be disposed adjacent to each other, and the second pixel 20 and the sixth pixel 60 emitting the same color may be disposed adjacent to each other. Through these arrangements of the pixels, the probability that the ink is erroneously adhered during an inkjet process may be reduced.

In addition, in an embodiment, unlikely the embodiment described with reference to FIG. 3, the first pixel area PX1 and the second pixel area PX2 may be alternately arranged in the first direction DR1. Accordingly, it is possible to prevent an empty space that is formed between the first pixel area PX1 and the second pixel area PX2 from being connected. Through these arrangements of the pixels, the display quality of the display device may be improved.

Figure 6:
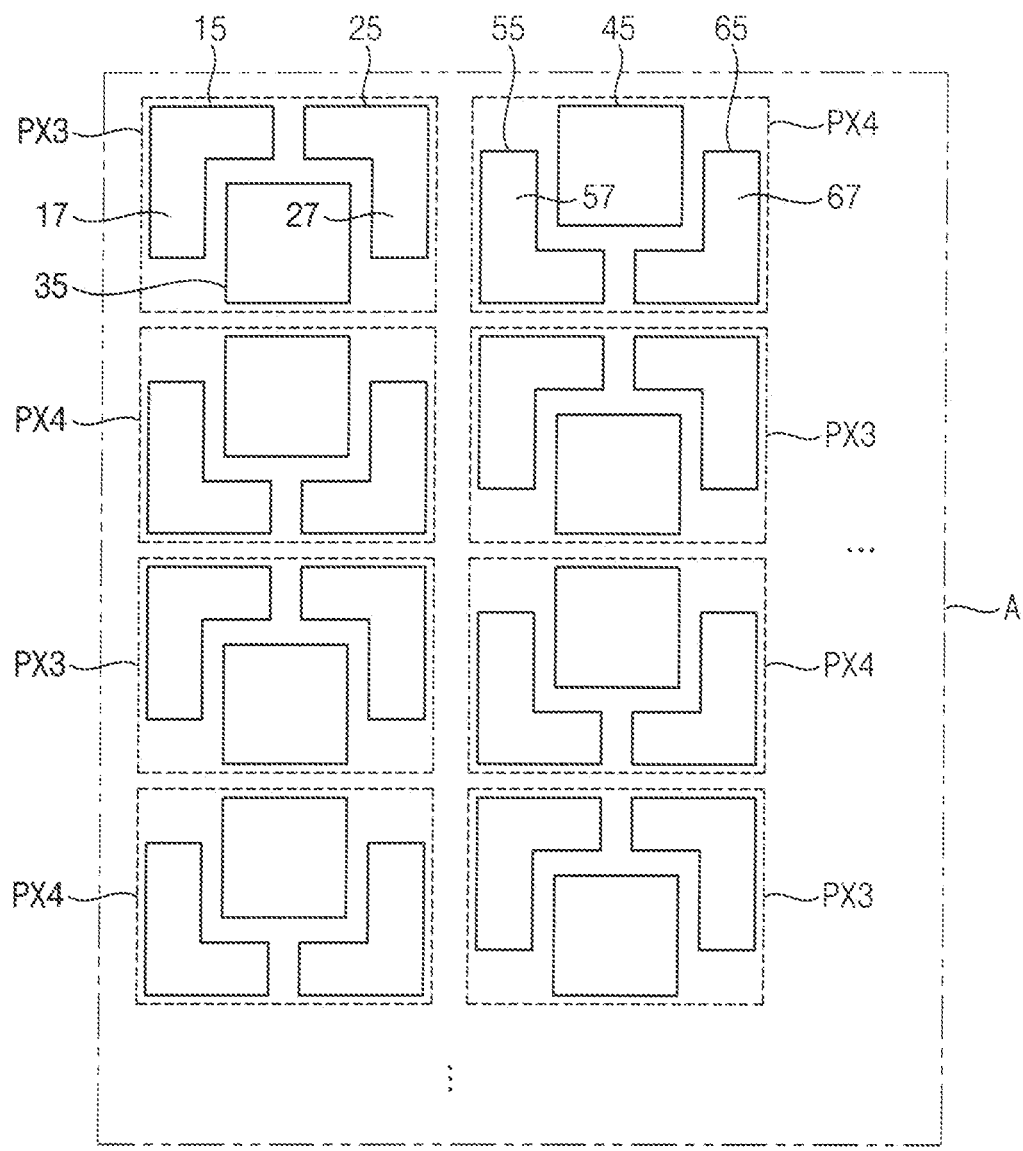
FIG. 6 is an enlarged view of the area A shown in FIG. 1 according to yet another embodiment.

FIG. 6 is an enlarged view of the area A shown in FIG. 1 according to yet another embodiment. FIG. 6 may be substantially the same as the structure of FIG. 5 except that some pixels in FIG. 5 have different shapes. Therefore, redundant descriptions will be omitted.

Referring to FIG. 6, the area A may include a first pixel area PX3 and a second pixel area PX4. The first pixel area PX3 may include the first pixel 15, the second pixel 25, and the third pixel 35. In an embodiment, the first pixel 15 may include a first protruding portion 17 protruding in the second direction DR2 toward the second pixel area PX4. The second pixel 25 may include a second protruding portion 27 protruding in the second direction DR2 toward the second pixel area PX4. The third pixel 35 may be disposed between the first protruding portion 17 and the second protruding portion 27.

The second pixel area PX4 may include a fourth pixel 45, a fifth pixel 55, and a sixth pixel 65. In an embodiment, the fifth pixel 55 may include a third protruding portion 57 protruding in a direction opposite to the second direction DR2 toward the first pixel area PX3. The sixth pixel 65 may include a fourth protruding portion 67 protruding in a direction opposite to the second direction DR2 toward the first pixel area PX3. The fourth pixel 45 may be disposed between the third protruding portion 57 and the fourth protruding portion 67.

Since the third pixel 35 and the fourth pixel 45 are disposed adjacent to each other in the second direction DR2 in the same pixel column, the probability of the ink being erroneously adhered during an inkjet process may be reduced.

In an embodiment, the first pixel area PX3 and the second pixel area PX4 may be alternately arranged in the second direction DR2. That is, the first pixel area PX3 may be located adjacent to the second pixel area PX4 in the second direction DR2. Accordingly, the fifth pixel 55 and the sixth pixel 65 are disposed adjacent to the first pixel 15 and the second pixel 25, respectively, and the probability of the ink being erroneously adhered during an inkjet process may be reduced.

In addition, in an embodiment, unlikely the embodiment described with reference to FIG. 4, the first pixel area PX3 and the second pixel area PX4 may be alternately arranged in the first direction DR1. Accordingly, it is possible to prevent an empty space that is formed between the first pixel area PX3 and the second pixel area PX4 from being connected.

In the present disclosure, the third pixel 35 and the fourth pixel 45 may be disposed to be adjacent to each other in the second direction DR2 in the same pixel column, and the fifth pixel 55 and the sixth pixel 65 may be disposed to be respectively adjacent to the first pixel 15 and the second pixel 25 adjacent to each other in the first direction DR1. Accordingly, the present disclosure may prevent erroneous adhesion of ink that may occur during an inkjet process. Also, the display quality of the display device may be improved.

Figure 7:
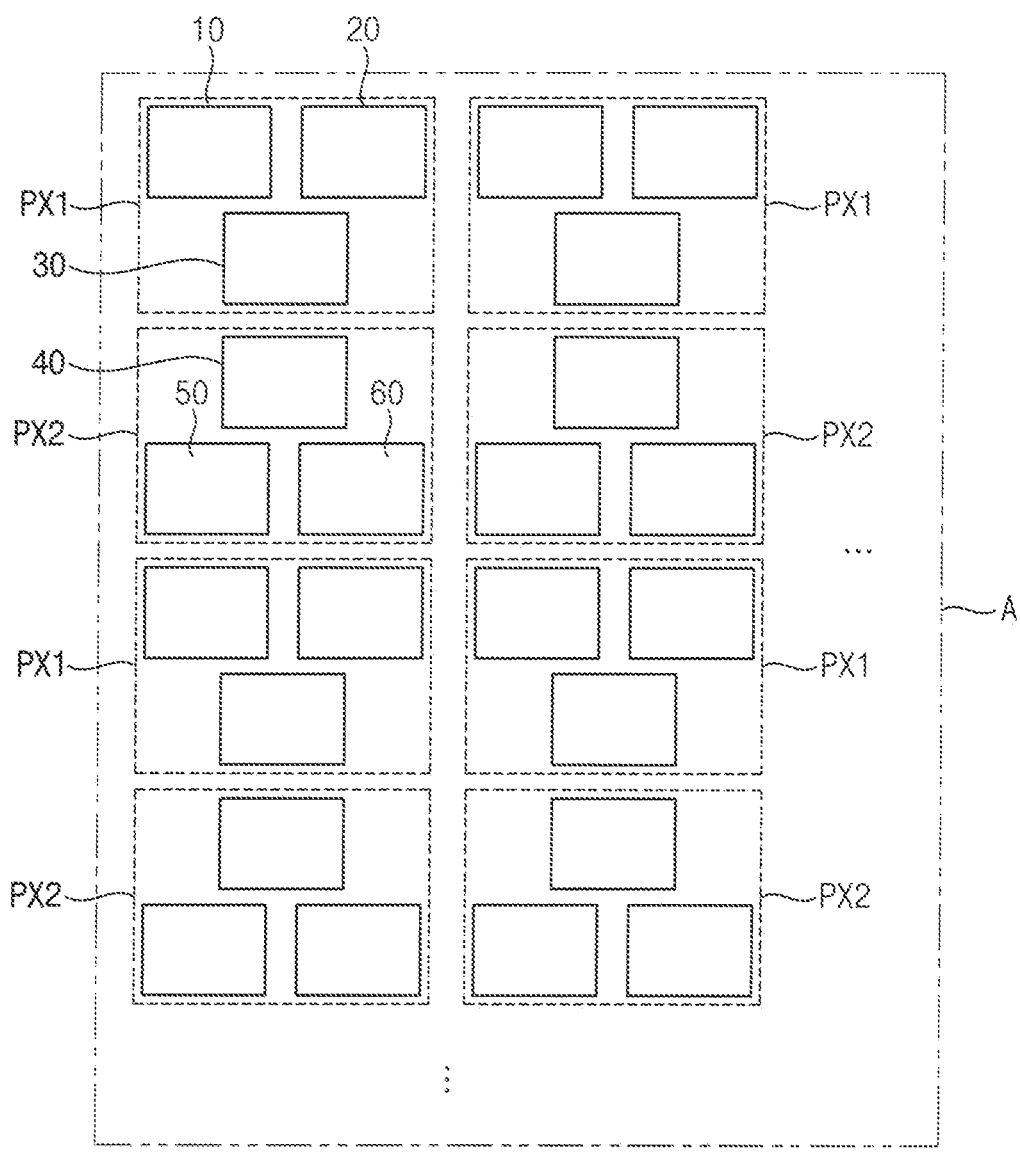
FIG. 7 is an enlarged view of the area A shown in FIG. 1 according to yet another embodiment.
Figure 7:
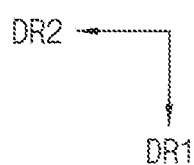

FIG. 7 is an enlarged view of the area A shown in FIG. 1 according to yet another embodiment. FIG. 7 may be substantially the same as the arrangement of the plurality of pixels of FIG. 3 except that the area A is rotated by 90 degrees in the counterclockwise direction. Therefore, redundant descriptions will be omitted.

Figure 8:
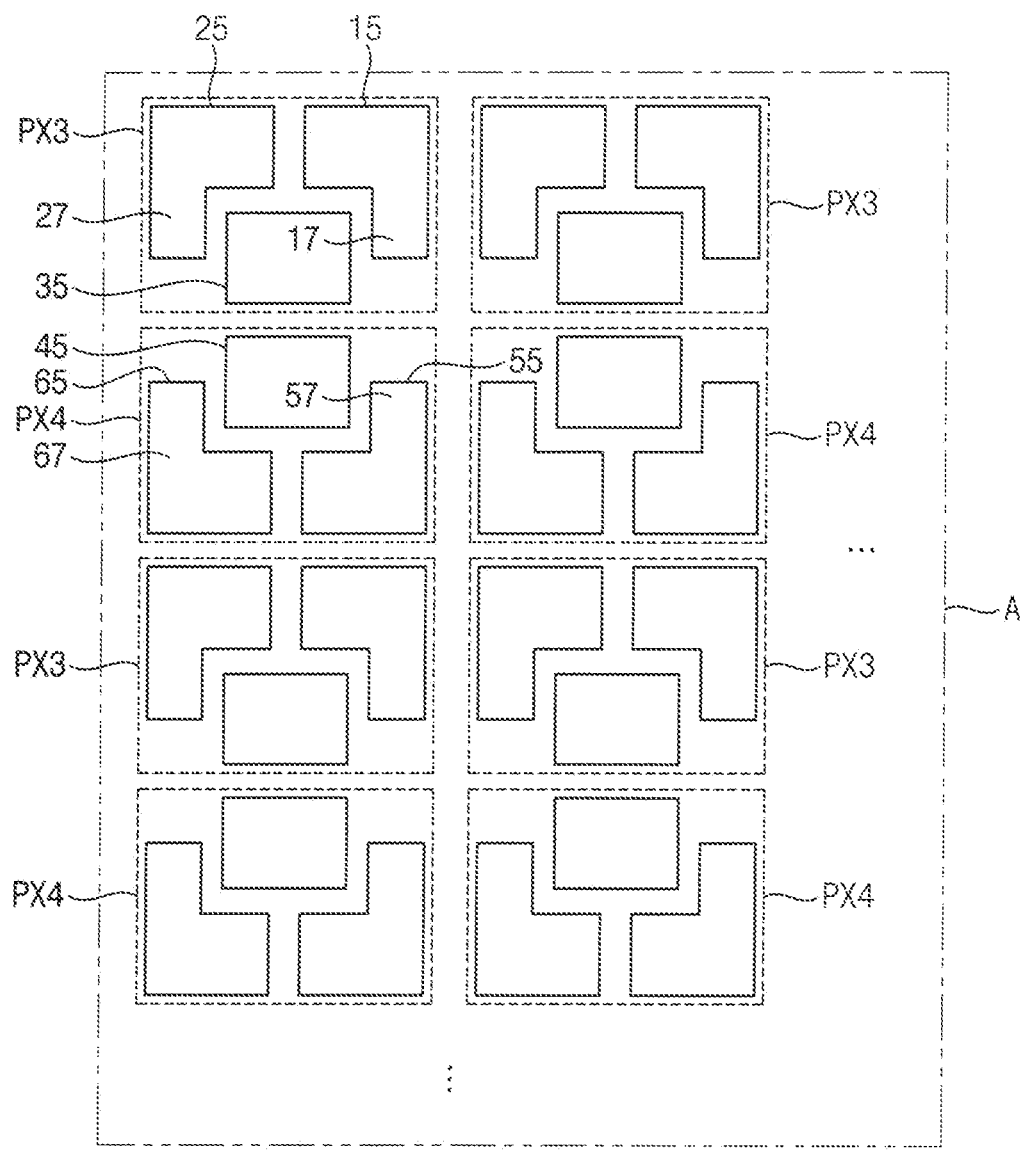
FIG. 8 is an enlarged view of the area A shown in FIG. 1 according to yet another embodiment.

FIG. 8 is an enlarged view of the area A shown in FIG. 1 according to yet another embodiment. FIG. 8 may be substantially the same as the arrangement of the plurality of pixels of FIG. 4 except that the area A is rotated by 90 degrees in the counterclockwise direction. Therefore, redundant descriptions will be omitted.

Figure 9:
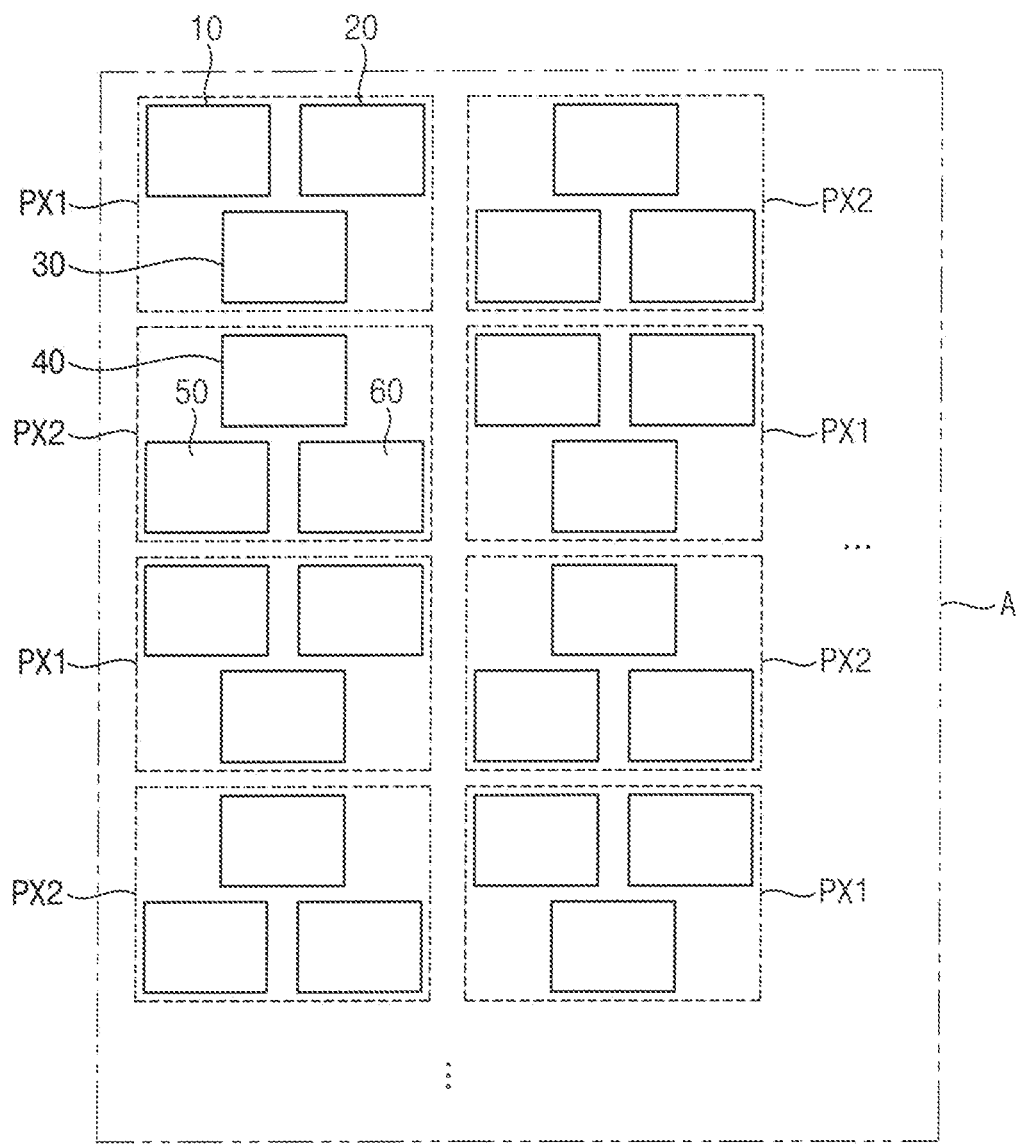
FIG. 9 is an enlarged view of the area A shown in FIG. 1 according to yet another embodiment.

FIG. 9 is an enlarged view of the area A shown in FIG. 1 according to yet another embodiment. FIG. 9 may be substantially the same as the arrangement of the plurality of pixels of FIG. 5 except that the area A is rotated by 90 degrees in the counterclockwise direction. Therefore, redundant descriptions will be omitted.

Figure 10:
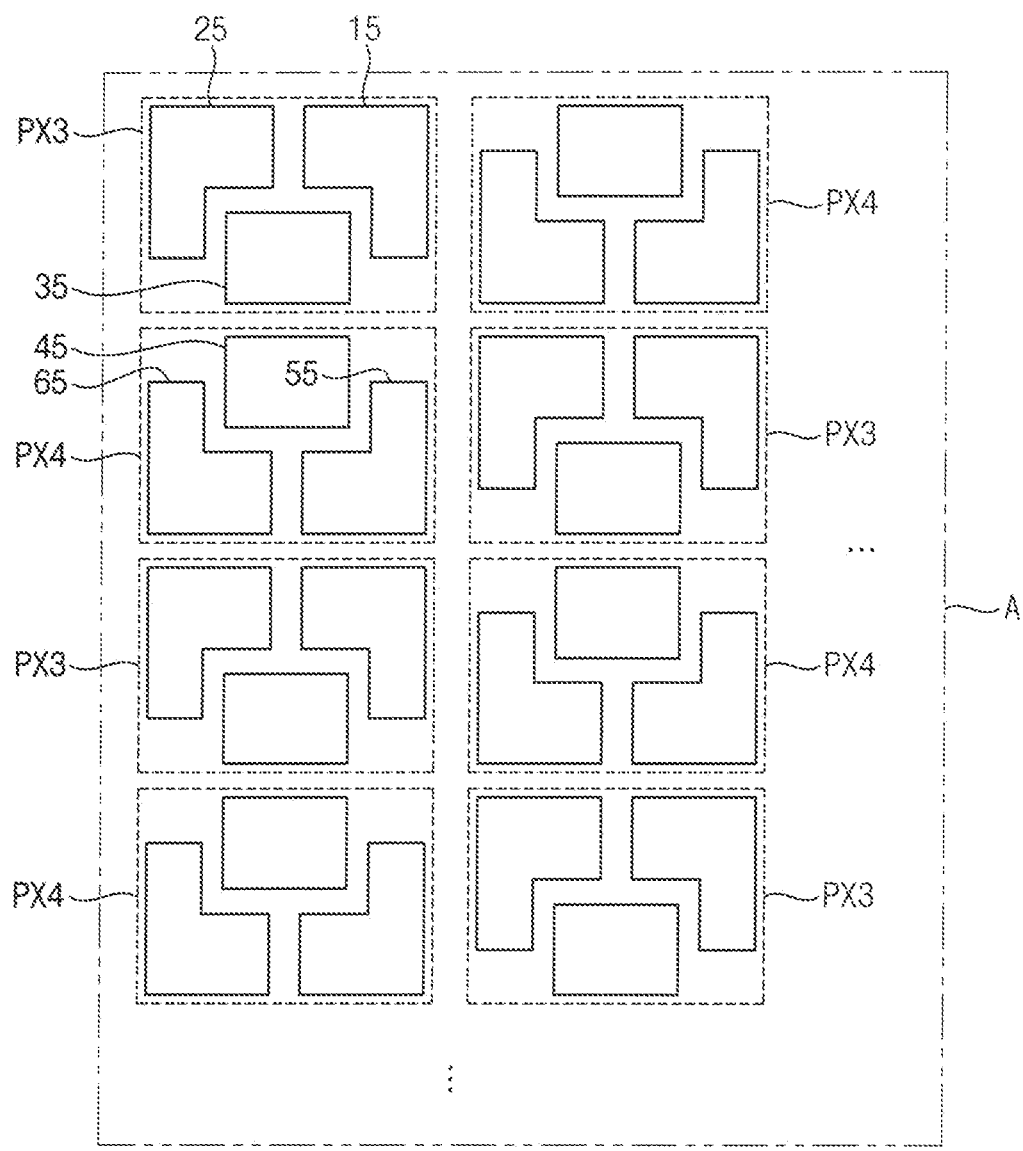
FIG. 10 is an enlarged view of the area A shown in FIG. 1 according to yet another embodiment.

FIG. 10 is an enlarged view of the area A shown in FIG. 1 according to yet another embodiment. FIG. 10 may be substantially the same as the arrangement of the plurality of pixels of FIG. 6 except that the area A is rotated by 90 degrees in the counterclockwise direction. Therefore, redundant descriptions will be omitted.

Figure 11:
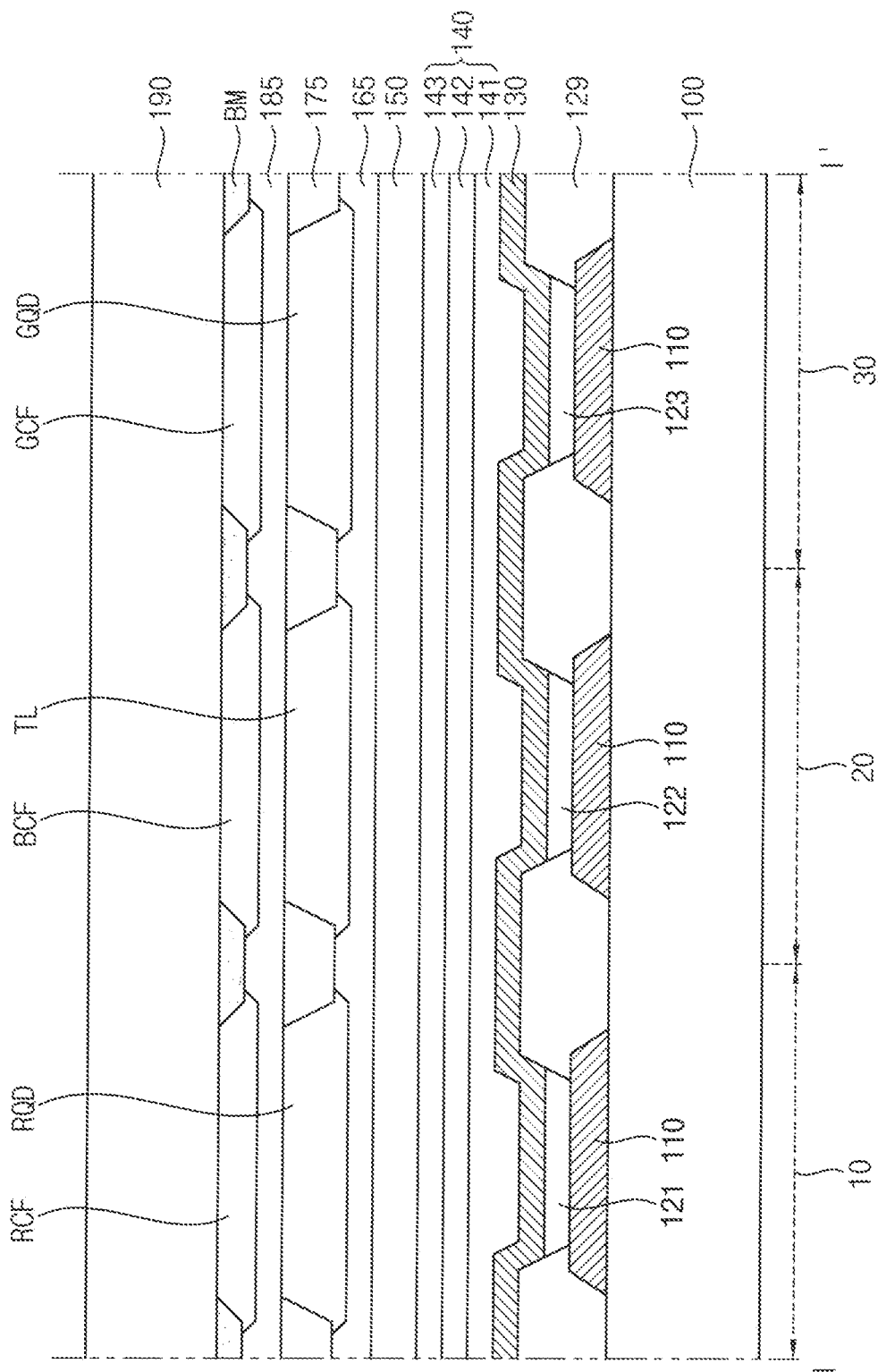
FIG. 11 is a cross-sectional view taken along the line I-I' of FIG. 1 according to another embodiment.

FIG. 11 is a cross-sectional view taken along the line I-I' of FIG. 1 according to another embodiment.

Referring to FIG. 11, the display device may include the first substrate 100, the plurality of first electrodes 110, the plurality of light emitting layers 121, 122, and 123, the second electrode 130, the pixel defining layer 129, the encapsulation layer 140, an adhesive layer 150, a first insulating layer 165, a plurality of partition walls 175, a plurality of color conversion patterns RQD and GQD, a transmission pattern TL, a second insulating layer 185, a plurality of color filters RCF, BCF, and GCF, a plurality of light blocking patterns BM, and the second substrate 190.

The first substrate 100 may include a transparent insulating substrate. For example, the first substrate 100 may include a glass substrate, a quartz substrate, a transparent resin substrate, or the like. The transparent resin substrate may include a polyimide-based resin, an acrylic-based resin, a polyacrylate-based resin, a polycarbonate-based resin, a polyether-based resin, a polyether-based resin, a sulfonic acid-based resin, a polyethylene terephthalate-based resin, and the like.

The first substrate 100 may further include other structures disposed on the insulating substrate. For example, the first substrate 100 may further include a line, an electrode, an insulating layer, and the like. In addition, the first substrate 100 may further include a plurality of thin film transistors disposed on the insulating substrate. Some of the plurality of thin film transistors may be connected to the plurality of first electrodes 110.

The first substrate 100 may include a first pixel area corresponding to the first pixel 10, a second pixel area corresponding to the second pixel 20, and a third pixel area corresponding to the third pixel 30. The pixel areas may be partitioned by the plurality of light blocking patterns BM.

The plurality of first electrodes 110 may be disposed on the first substrate 100. The plurality of first electrodes 110 may be disposed to be spaced apart from each other. In an embodiment, the plurality of first electrodes 110 may be pixel electrodes disposed for each of the plurality of pixels. In another embodiment, the plurality of first electrodes 110 may be anode electrodes or cathode electrodes. The plurality of first electrodes 110 may include a transparent conductive material such as indium-tin oxide ("ITO"), indium-zinc oxide ("IZO"), zinc oxide ("ZnO"), and indium oxide ("In$_2$O$_3$"). Alternatively, the plurality of first electrodes 110 may include silver ("Ag"), magnesium ("Mg"), aluminum ("Al"), platinum ("Pt"), lead ("Pb"), gold ("Au"), nickel ("Ni"), niobium ("Nd"), iridium ("Ir"), chromium ("Cr"), lithium ("Li"), calcium ("Ca"), or any mixture thereof.

The pixel defining layer 129 may be disposed on the first substrate 100 to cover a portion of the plurality of first electrodes 110. That is, the pixel defining layer 129 may form an opening exposing at least a portion of each of the plurality of first electrodes 110. The pixel defining layer 129 may include an organic material or an inorganic material. For example, the pixel defining layer 129 may include a photoresist, a polyimide resin, an acrylic resin, a silicone compound, and a polyacrylic resin.

Each of the plurality of light emitting layers 121, 122, and 123 may be disposed on the plurality of first electrodes 110 in the openings of the pixel defining layer 129. In an embodiment, each of the plurality of light emitting layers 121, 122, and 123 may emit light of the same color, for example, blue light. In another embodiment, the plurality of light emitting layers 121, 122, and 123 may emit light of different colors.

The second electrode 130 may be disposed on the plurality of light emitting layers 121, 122, and 123 and the pixel defining layer 129. The second electrode 130 may be a common electrode disposed to cover the plurality of pixels.

The encapsulation layer 140 may be disposed on the second electrode 130. The first inorganic layer 141 and the second inorganic layer 143 of the encapsulation layer 140 may include at least one of silicon oxide ("$SiO_x$"), silicon nitride ("$SiN_x$"), and silicon oxynitride ("$SiO_xN_y$"). The organic layer 142 may include one or more of epoxy, acrylate, and urethane acrylate.

The adhesive layer 150 may be disposed on the encapsulation layer 140. The adhesive layer 150 may be used to bond the first substrate 100 on which the encapsulation layer 140 is formed and the second substrate 190 on which the second insulating layer 185 is formed.

The first insulating layer 165 may be disposed on the adhesive layer 150. The first insulating layer 165 may cover the plurality of color conversion patterns RQD and GQD and the transmission pattern TL. For example, the first insulating layer 165 may include an inorganic insulating material such as silicon nitride ("$SiN_x$").

The first color conversion pattern RQD may be disposed in the first pixel area corresponding to the first pixel 10. The first color conversion pattern RQD may be a red color conversion pattern. For example, the first color conversion pattern RQD may include red quantum dot particles and/or a red phosphor. In addition, the first color conversion pattern RQD may further include scattering particles such as titanium dioxide ("$TiO_2$").

The second color conversion pattern GQD may be disposed in the third pixel area corresponding to the third pixel 30. The second color conversion pattern GQD may be a green color conversion pattern. For example, the second color conversion pattern GQD may include green quantum dot particles and/or green phosphors. In addition, the third color conversion pattern GQD may further include scattering particles such as titanium dioxide ("$TiO_2$").

The red or green quantum dots are materials having a crystal structure of several nanometers, and may include hundreds to thousands of atoms. Since the quantum dots are tiny, a quantum confinement effect may occur in the plurality of color conversion patterns RQD and GQD.

The composition of the quantum dot is not particularly limited, and may be made of group II-VI elements, group III-V elements, group IV elements, or group IV-VI elements.

The group II element may be at least one selected from the group consisting of zinc, cadmium, and mercury. The group III element may be at least one selected from the group consisting of aluminum, gallium, and indium. The group IV element may be at least one selected from the group consisting of silicon, germanium, tin, and lead. The group V element may be at least one selected from the group consisting of nitrogen, phosphorus and arsenic. The group VI may be any one selected from the group consisting of sulfur, selenium, and tellunium.

The transmission pattern TL may include scattering particles that may change a direction of incident light (e.g., blue light) without changing the color of the incident light when passing through the transmission pattern TL.

The partition walls 175 may be formed between adjacent ones of the plurality of color conversion patterns RQD and GQD and the transmission pattern TL. The plurality of color conversion patterns RQD and GQD and the transmission pattern TL may be separated by the partition walls 175.

The second insulating layer 185 may be disposed on the plurality of color conversion patterns RQD and GQD and the transmission pattern TL. The second insulating layer 185 may cover the plurality of color filters RCF, BCF, and GCF. For example, the second insulating layer 185 may include an inorganic insulating material such as silicon nitride ("$SiN_x$").

The plurality of color filters RCF, BCF, and GCF may be disposed on the second insulating layer 185. The plurality of color filters RCF, BCF, and GCF may include a first color filter RCF, a second color filter BCF, and a third color filter GCF.

The first color filter RCF may be disposed in the first pixel area corresponding to the first pixel 10. The first color filter RCF may be a red color filter. The first color filter RCF may selectively pass light in a wavelength band that corresponds to the red light of the light.

The second color filter BCF may be disposed in the second pixel area corresponding to the second pixel 20. The second color filter BCF may be a blue color filter. The second color filter BCF may selectively pass light in a wavelength band that corresponds to blue light of light.

The third color filter GCF may be disposed in the third pixel area corresponding to the third pixel 30. The third color filter GCF may be a green color filter. The third color filter GCF may selectively pass light in a wavelength band that corresponds to green light of light passing through the third color filter GCF.

The plurality of light blocking patterns BM may be disposed on the second insulating layer 185. The plurality of light blocking patterns BM may include a material that blocks light. For example, the light blocking patterns BM may include an organic material that absorbs light. The light blocking patterns BM may be disposed between the pixel areas of the first pixel 10, the second pixel 20, and the third pixel.

The second substrate 190 may be disposed on the plurality of color filters RCF, BCF, and GCF and the plurality of light blocking patterns BM. The second substrate 190 may include a transparent insulating substrate. For example, the second substrate 190 may include a glass substrate, a quartz substrate, a transparent resin substrate, or the like.

The display device disclosed herein may be applied to a display device included in various electronic device such as a computer, a notebook, a mobile phone, a smartphone, a smart pad, a portable media player (PMP), a personal digital assistant (PDA), an MP3 player, or the like.

Although the display devices according to some embodiments have been described with reference to the drawings, the illustrated embodiments are merely examples, and may be modified and changed by a person having ordinary knowledge in the relevant technical field without departing from the technical spirit of the present disclosure including the following claims.

What is claimed is:

1. A display device comprising:
    a display panel including a display area which includes a plurality of first pixel areas and a plurality of second pixel areas,
    wherein each of the plurality of first pixel areas includes a first pixel emitting a first color, a second pixel emitting a second color, and a third pixel emitting a third color, wherein each of the plurality of second pixel areas includes a fourth pixel emitting the third color, a fifth pixel emitting the first color, and a sixth pixel emitting the second color, wherein the first pixel and the second pixel are arranged to be adjacent to each other in a first direction, and the third pixel is arranged to be adjacent to the first pixel and the second pixel in a second direction that intersects the first direction, wherein the third pixel and the fourth pixel are arranged to be adjacent to each other in the second direction, the fifth pixel is spaced apart from the first pixel in the second direction, and the sixth pixel is spaced apart from the second pixel in the second direction, and wherein the plurality of first pixel areas are repeatedly arranged along the first direction throughout the display area with no intervening second pixel area disposed between adjacent first pixel areas.

2. The display device of claim 1, wherein the plurality of first pixel areas and the plurality of second pixel areas are alternately arranged in the second direction.

3. The display device of claim 2, wherein the plurality of second pixel areas are repeatedly arranged along the first direction throughout the display area with no intervening first pixel area disposed between adjacent second pixel areas.

4. The display device of claim 2, wherein the first pixel area and the second pixel area are alternately arranged in the first direction.

5. The display device of claim 1, wherein the first color, the second color, and the third color are different from each other.

6. The display device of claim 1, wherein each of the first pixel, the second pixel, the third pixel, the fourth pixel, the fifth pixel, and the sixth pixel has a rectangular shape.

7. The display device of claim 1, wherein the first pixel includes a first protruding portion protruding in the second direction toward the fifth pixel, the second pixel includes a second protruding portion protruding in the second direction toward the sixth pixel, and the third pixel is disposed between the first protruding portion and the second protruding portion, and wherein the fifth pixel includes a third protruding portion protruding in a direction opposite to the second direction toward the first pixel, the sixth pixel includes a fourth protruding portion protruding in a direction opposite to the second direction toward the second pixel, and the fourth pixel is disposed between the third protruding portion and the fourth protruding portion.

8. The display device of claim 1, wherein the plurality of first pixel areas and the plurality of second pixel areas are arranged in a matrix form.

9. The display device of claim 1, wherein the plurality of first pixel areas and the plurality of second pixel areas are symmetrical by a line extending in the first direction.

10. The display device of claim 1, wherein each of the first pixel, the second pixel, the third pixel, the fourth pixel, the fifth pixel, and the sixth pixel includes a color filter that is formed by an inkjet process.

\* \* \* \* \*